US011745213B2

(12) United States Patent
Aratake et al.

(10) Patent No.: US 11,745,213 B2
(45) Date of Patent: Sep. 5, 2023

(54) SUBSTRATE PROCESSING APPARATUS AND APPARATUS CLEANING METHOD

(71) Applicant: Tokyo Electron Limited, Tokyo (JP)

(72) Inventors: Hidemasa Aratake, Koshi (JP); Osamu Kuroda, Koshi (JP); Kouzou Kanagawa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 267 days.

(21) Appl. No.: 17/068,964

(22) Filed: Oct. 13, 2020

(65) Prior Publication Data

US 2021/0114057 A1 Apr. 22, 2021

(30) Foreign Application Priority Data

Oct. 17, 2019 (JP) .................................. 2019-189979

(51) Int. Cl.
*B05C 11/10* (2006.01)
*H01L 21/304* (2006.01)
*H01L 21/02* (2006.01)
*H01L 21/3213* (2006.01)
*B08B 3/04* (2006.01)

(52) U.S. Cl.
CPC ...... *B05C 11/1036* (2013.01); *B05C 11/1026* (2013.01); *B08B 3/04* (2013.01); *H01L 21/02041* (2013.01); *H01L 21/304* (2013.01); *H01L 21/32133* (2013.01)

(58) Field of Classification Search
None
See application file for complete search history.

(56) References Cited

U.S. PATENT DOCUMENTS

| | | | | |
|---|---|---|---|---|
| 5,565,034 A | * | 10/1996 | Nanbu | H01L 21/67265 118/712 |
| 6,792,958 B2 | * | 9/2004 | Kamikawa | H01L 21/67017 134/186 |
| 6,848,625 B2 | * | 2/2005 | Takekuma | H01L 21/6715 239/69 |
| 7,063,094 B2 | * | 6/2006 | Amai | H01L 21/67051 134/104.1 |

(Continued)

FOREIGN PATENT DOCUMENTS

JP H03-038827 A 2/1991

*Primary Examiner* — Jethro M. Pence
(74) *Attorney, Agent, or Firm* — Pearne & Gordon LLP

(57) ABSTRACT

A substrate processing apparatus includes a processing tub, a liquid recovery unit, a liquid recovery unit drain line, a storage, a first and a second liquid supply lines, a discharge line, a first and a second liquid flow rate controllers. The liquid recovery unit receives a processing liquid overflown from the processing tub. The liquid recovery unit drain line drains the processing liquid from the liquid recovery unit. The first and the second liquid supply lines supply a first and a second liquids, respectively. The cleaning liquid contains the first liquid and the second liquid, and removes a precipitate from the processing liquid. The discharge line discharges the cleaning liquid, the first liquid or the second liquid toward the liquid recovery unit. The first and the second liquid flow rate controllers are provided at the first and the second liquid supply lines, and adjust flow rates thereof, respectively.

17 Claims, 6 Drawing Sheets

(56) References Cited

U.S. PATENT DOCUMENTS

| | | | | |
|---|---|---|---|---|
| 7,472,713 | B2* | 1/2009 | Amai | H01L 21/67051 |
| | | | | 134/104.1 |
| 8,171,876 | B2* | 5/2012 | Namekawa | B41J 2/18 |
| | | | | 347/85 |
| 8,387,630 | B2* | 3/2013 | Yamamoto | H01L 21/6708 |
| | | | | 134/902 |
| 8,661,704 | B2* | 3/2014 | Nakashima | H01L 21/67034 |
| | | | | 34/200 |
| 8,883,030 | B2* | 11/2014 | Miyagi | B05C 11/10 |
| | | | | 216/93 |
| 9,238,245 | B2* | 1/2016 | Ishii | H01L 21/6715 |
| 9,255,331 | B2* | 2/2016 | Tanaka | C23C 18/1632 |
| 9,401,291 | B2* | 7/2016 | Mimura | H01L 21/67253 |
| 9,421,569 | B2* | 8/2016 | Tanaka | C23C 18/1676 |
| 9,713,822 | B2* | 7/2017 | Miyagi | B05C 11/10 |
| 9,811,096 | B2* | 11/2017 | Hayashi | G05D 11/13 |
| 10,612,143 | B2* | 4/2020 | Komori | C23C 16/14 |
| 10,731,256 | B2* | 8/2020 | Iwai | C23C 18/1676 |
| 10,790,169 | B2* | 9/2020 | Osada | B08B 1/04 |
| 11,318,504 | B2* | 5/2022 | Kawaguchi | H01L 21/67178 |
| 11,446,588 | B2* | 9/2022 | Goshi | B05C 11/1013 |
| 11,515,169 | B2* | 11/2022 | Yamaguchi | C23C 16/18 |
| 2013/0167877 | A1* | 7/2013 | Fujiwara | H01L 21/67051 |
| | | | | 134/105 |
| 2014/0120264 | A1* | 5/2014 | Inatomi | C23C 18/1683 |
| | | | | 118/712 |
| 2018/0197756 | A1* | 7/2018 | Hashizume | H01L 21/02057 |
| 2019/0131120 | A1* | 5/2019 | Yamaguchi | H01L 21/022 |
| 2019/0134677 | A1* | 5/2019 | Terao | B08B 3/02 |
| 2021/0225667 | A1* | 7/2021 | Iwao | H01L 21/304 |
| 2022/0219209 | A1* | 7/2022 | Kawaguchi | H01L 21/67028 |

* cited by examiner

SUBSTRATE PROCESSING APPARATUS AND APPARATUS CLEANING METHOD

CROSS-REFERENCE TO RELATED APPLICATION

This application claims the benefit of Japanese Patent Application No. 2019-189979 filed on Oct. 17, 2019, the entire disclosure of which is incorporated herein by reference.

TECHNICAL FIELD

The various aspects and embodiments described herein pertain generally to a substrate processing apparatus and an apparatus cleaning method.

BACKGROUND

Conventionally, there is known a batch processing of processing a plurality of substrates belonging to a single lot all at once by immersing the lot in a processing tub in which a processing liquid is stored.
Patent Document 1: Japanese Patent Laid-open Publication No. H03-038827

SUMMARY

In an exemplary embodiment, a substrate processing apparatus includes a processing tub, a liquid recovery unit, a liquid recovery unit drain line, a storage, a first liquid supply line, a second liquid supply line, a discharge line, a first liquid flow rate controller and a second liquid flow rate controller. The processing tub is allowed to accommodate therein multiple substrates, and configured to store therein a processing liquid. The liquid recovery unit is configured to receive the processing liquid overflown from the processing tub. The liquid recovery unit drain line is configured to drain the processing liquid from the liquid recovery unit. The storage is connected to the liquid recovery unit via the liquid recovery unit drain line, and configured to store therein the processing liquid drained from the liquid recovery unit. The first liquid supply line is configured to supply a first liquid of a cleaning liquid configured to remove a precipitate from the processing liquid, and the cleaning liquid contains the first liquid and a second liquid. The second liquid supply line is configured to supply the second liquid. The discharge line is connected to the first liquid supply line and the second liquid supply line, and configured to discharge the cleaning liquid, the first liquid or the second liquid toward the liquid recovery unit. The first liquid flow rate controller is provided at the first liquid supply line, and configured to adjust a flow rate of the first liquid flowing in the first liquid supply line. The second liquid flow rate controller is provided at the second liquid supply line, and configured to adjust a flow rate of the second liquid flowing in the second liquid supply line.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
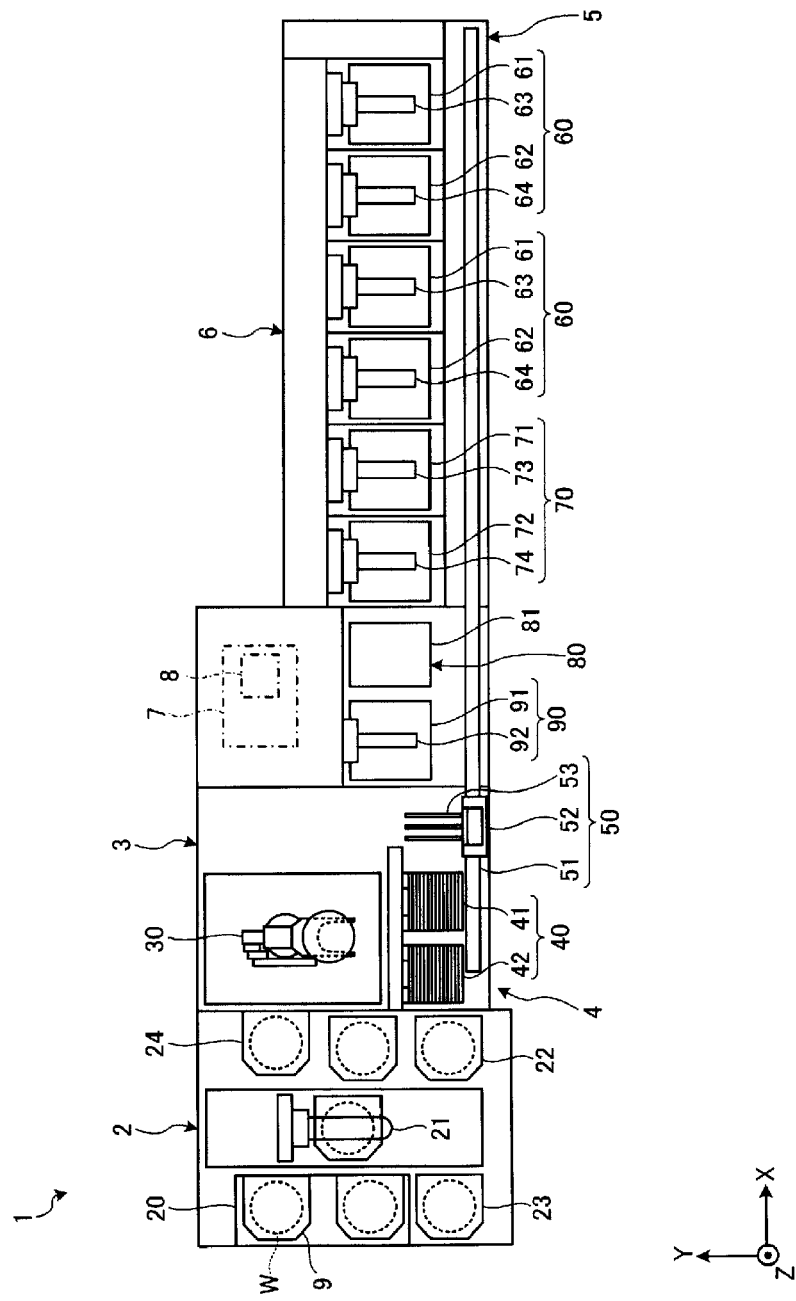
FIG. 1 is a plan view of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments for a substrate processing apparatus and an apparatus cleaning method according to the present disclosure (hereinafter, referred to as "exemplary embodiments") will be described in detail with reference to the accompanying drawings. Further, it should be noted that the substrate processing apparatus and the apparatus cleaning method according to the present disclosure are not limited to the exemplary embodiments. Unless processing contents are not contradictory, the disclosures in the various exemplary embodiments can be combined appropriately. Further, in the various exemplary embodiments to be described below, same parts will be assigned same reference numerals, and redundant description will be omitted.

Further, in the various accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction.

Configuration of Substrate Processing Apparatus

First, a configuration of a substrate processing apparatus according to an exemplary embodiment will be described with reference to FIG. 1. FIG. 1 is a plan view of a substrate processing apparatus 1 according to the exemplary embodiment.

As illustrated in FIG. 1, the substrate processing apparatus 1 according to the exemplary embodiment includes a carrier carry-in/out unit 2, a lot forming unit 3, a lot placing unit 4, a lot transferring unit 5, a lot processing unit 6 and a controller 7.

The carrier carry-in/out unit 2 is equipped with a carrier stage 20, a carrier transfer mechanism 21, carrier stocks 22 and 23, and a carrier placing table 24.

The carrier stage 20 places a plurality of carriers 9 transferred from the outside. Each of the carriers 9 is a container configured to accommodate a plurality (e.g., twenty five sheets) of wafers W vertically arranged in a horizontal posture. The carrier transfer mechanism 21 transfers each of the carriers 9 between the carrier stage 20, the carrier stocks 22 and 23 and the carrier placing table 24.

A plurality of wafers W before being processed is carried out from the carrier 9 placed on the carrier placing table 24 to the lot processing unit 6 by a substrate transfer mechanism 30 to be described later. Further, a plurality of wafers W after being processed is carried into the carrier 9 placed on the carrier placing table 24 from the lot processing unit 6 by the substrate transfer mechanism 30.

The lot forming unit 3 is equipped with the substrate transfer mechanism 30 to form a lot. The lot is formed of a plurality (e.g., fifty sheets) of wafers W to be processed simultaneously by combining wafers W accommodated in one or more carriers 9. The wafers W in the lot is arranged with their plate surfaces facing each other at a predetermined interval.

The substrate transfer mechanism 30 transfers the wafers W between the carrier 9 placed on the carrier placing table 24 and the lot placing unit 4.

The lot placing unit 4 is equipped with a lot placing table 40 to temporarily place (stand by) a lot to be transferred between the lot forming unit 3 and the lot processing unit 6 by the lot transferring unit 5. The lot placing table 40 is equipped with a carry-in side lot placing table 41 on which a lot before being processed, which is formed by the lot forming unit 3, is placed; and a carry-out side lot placing table 42 on which a lot after being processed by the lot processing unit 6 is placed. On the carry-in side lot placing table 41 and the carry-out side lot placing table 42, the wafers W corresponding to a single lot is arranged side by side in an upright posture.

The lot transferring unit 5 is equipped with a lot transferring mechanism 50 to transfer the lot between the lot placing unit 4 and the lot processing unit 6 or within the lot processing unit 6. The lot transferring mechanism 50 is equipped with a rail 51, a moving body 52 and a substrate holder 53.

The rail 51 is placed along the lot placing unit 4 and the lot processing unit 6 in the X-axis direction. The moving body 52 is configured to be movable along the rail 51 while holding the wafers W. The substrate holder 53 is provided on the moving body 52 to hold the wafers W arranged side by side in the upright posture.

The lot processing unit 6 performs an etching processing, a cleaning processing, and a drying processing to the wafers W arranged side by side in the upright posture as a single lot. In the lot processing unit 6, two etching apparatuses 60, a cleaning apparatus 70, a substrate holder cleaning apparatus 80 and a drying apparatus 90 are provided along the rail 51.

The etching apparatus 60 is configured to perform the etching processing on the lot. The cleaning apparatus 70 is configured to perform the cleaning processing on the lot. The substrate holder cleaning apparatus 80 is configured to perform the cleaning processing on the substrate holder 53. The drying apparatus 90 is configured to perform the drying processing on the lot. Here, the numbers of the etching apparatuses 60, the cleaning apparatus 70, the substrate holder cleaning apparatus 80 and the drying apparatus 90 is not limited to the example illustrated in FIG. 1.

Each of the etching apparatuses 60 includes a processing tub 61 for etching, a processing tub 62 for rinsing, and substrate elevating devices 63 and 64.

The processing tub 61 can accommodate the wafers W for the single lot arranged in the upright posture, and store a processing liquid for etching (hereinafter, also referred to as "etching liquid") therein. Details of the processing tub 61 will be described below.

The processing tub 62 stores a processing liquid for rinsing (pure water or the like) therein. In each of the substrate elevating devices 63 and 64, the wafers W belonging to the lot are held as arranged side by side in the upright posture.

The etching apparatus 60 is configured to hold, with the substrate elevating device 63, the lot transferred by the lot transferring unit 5 and perform the etching processing by immersing the lot in the etching liquid in the processing tub 61. The etching processing is performed for, e.g., from about 1 hour to about 3 hours.

The lot after being etched in the processing tub 61 is transferred by the lot transferring unit 5 to the processing tub 62. Then, the etching apparatus 60 holds the transferred lot with the substrate elevating device 64 and performs the rinsing processing by immersing the lot in the rinsing liquid in the processing tub 62. The lot after being rinsed in the processing tub 62 is transferred by the lot transferring unit 5 to a processing tub 71 of the cleaning apparatus 70.

The cleaning apparatus 70 is equipped with the processing tub 71 for cleaning, a processing tub 72 for rinsing and substrate elevating devices 73 and 74. The processing tub 71 for cleaning stores a processing liquid for cleaning (e.g., SC-1 (a mixed solution of ammonia, hydrogen peroxide and water) or the like) therein.

The processing tub 72 for rinsing stores a processing liquid for rinsing (pure water or the like) therein. In each of the substrate elevating devices 73 and 74, the wafers W belonging to the single lot are held as arranged side by side in the upright posture.

The cleaning apparatus 70 is configured to hold, with the substrate elevating device 73, the lot transferred by the lot transferring unit 5 and perform the cleaning processing by immersing the lot in a cleaning liquid in the processing tub 71.

The lot after being cleaned in the processing tub 71 is transferred by the lot transferring unit 5 to the processing tub 72. Then, the cleaning apparatus 70 is configured to hold the transferred lot with the substrate elevating device 74 and perform the rinsing processing by immersing the lot in the rinsing liquid in the processing tub 72. The lot after being rinsed in the processing tub 72 is transferred by the lot transferring unit 5 to a processing tub 91 of the drying apparatus 90.

The drying apparatus 90 is equipped with the processing tub 91 and a substrate elevating device 92. The processing tub 91 is supplied with a processing gas for drying (e.g., isopropyl alcohol (IPA) or the like). In the substrate elevating device 92, the wafers W belonging to the single lot are held as arranged side by side in the upright posture.

The drying apparatus 90 is configured to hold, with the substrate elevating device 92, the lot transferred by the lot transferring unit 5 and perform the drying processing with the processing gas for drying supplied into the processing tub 91. The lot after being dried in the processing tub 91 is transferred by the lot transferring unit 5 to the lot placing unit 4.

The substrate holder cleaning apparatus 80 is configured to perform the cleaning processing on the substrate holder 53 by supplying the processing liquid for cleaning to the substrate holder 53 of the lot transferring mechanism 50 and supplying the drying gas.

The controller 7 controls the operations of the respective units (the carrier carry-in/out unit 2, the lot forming unit 3, the lot placing unit 4, the lot transferring unit 5, the lot processing unit 6 and the like) of the substrate processing apparatus 1. The controller 7 controls the operations of the respective units of the substrate processing apparatus 1 based on signals from a switch or various sensors.

The controller 7 is, e.g., a computer, and includes a computer-readable storage medium 8. The storage medium 8 stores a program for controlling various processings that are executed in the substrate processing apparatus 1.

The controller 7 reads and executes the program stored in the storage medium 8 to control the operations of the substrate processing apparatus 1. Further, the program may be a program that has been stored in the computer-readable storage medium 8 and may be installed in the storage medium 8 of the controller 7 from the other storage medium.

Examples of the computer-readable storage medium 8 include a hard disc (HD), a flexible disc (FD), a compact disc (CD), a magnet optical disc (MO), and a memory card.

Configuration of Processing Tub for Etching

Figure 2:
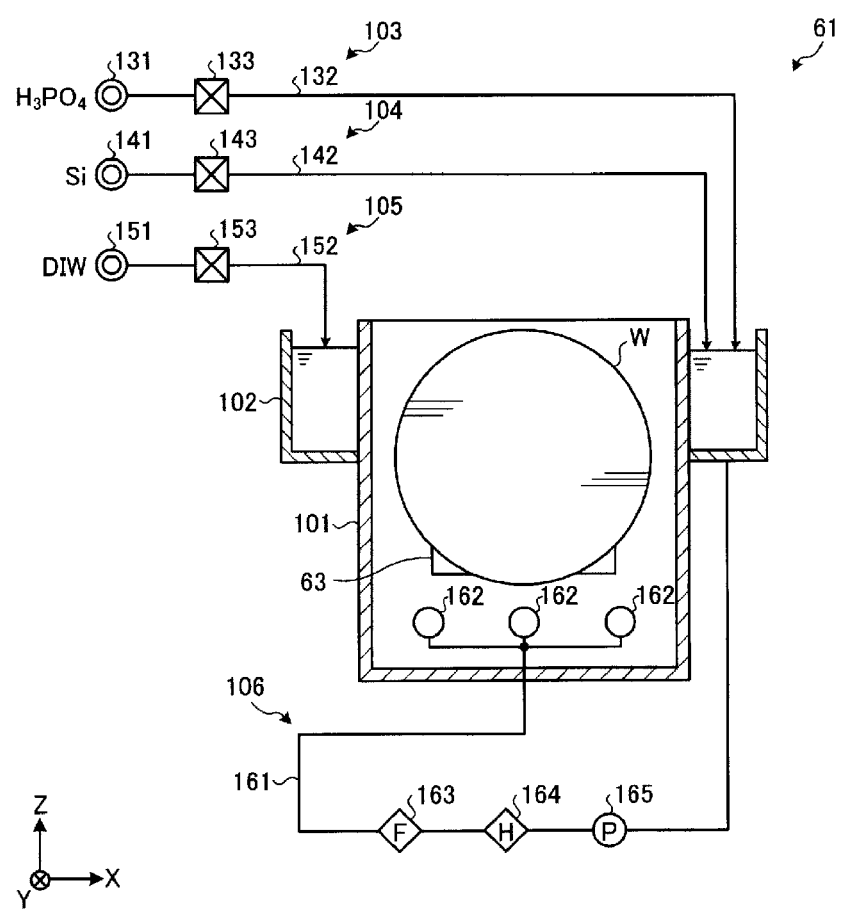
FIG. 2 is a block diagram illustrating a configuration of a processing tub for etching according to the exemplary embodiment.

Hereinafter, the processing tub 61 for etching will be described with reference to FIG. 2. FIG. 2 is a block diagram illustrating a configuration of a processing tub 61 for etching according to the exemplary embodiment.

In the processing tub 61, the etching processing of selectively etching a silicon nitride film (SiN) between the silicon nitride film and a silicon oxide film ($SiO_2$) formed on the wafer W with a predetermined etching liquid is performed. In the etching processing, a solution in which a silicon (Si)-containing compound is added to a phosphoric acid ($H_3PO_4$) aqueous solution to adjust the silicon concentration is used as the etching liquid.

As a method of adjusting the silicon concentration in the etching liquid, a method of immersing a dummy substrate in the phosphoric acid aqueous solution and dissolving silicon (seasoning) or a method of dissolving a silicon-containing compound, such as colloidal silica, in the phosphoric acid aqueous solution can be used. Otherwise, the silicon concentration may be adjusted by adding a silicon-containing compound aqueous solution into the phosphoric acid aqueous solution.

As illustrated in FIG. 2, the processing tub 61 for etching includes an inner tub 101 and an outer tub 102. The inner tub 101 is a box-shaped tub whose top is opened and stores the etching liquid therein. The lot formed of the wafers W is immersed in the inner tub 101. The outer tub 102 has an open top and is placed around an upper portion of the inner tub 101. The outer tub 102 is supplied with the etching liquid overflowing from the inner tub 101.

Further, the processing tub 61 includes a phosphoric acid aqueous solution supply 103, a silicon supply 104 and a DIW supply 105.

The phosphoric acid aqueous solution supply 103 includes a phosphoric acid aqueous solution source 131, a phosphoric acid aqueous solution supply line 132 and a flow rate controller 133.

The phosphoric acid aqueous solution source 131 is configured to supply the phosphoric acid aqueous solution in which phosphoric acid is concentrated to a desired concentration. The phosphoric acid aqueous solution supply line 132 connects the phosphoric acid aqueous solution source 131 and the outer tub 102 to supply the phosphoric acid aqueous solution from the phosphoric acid aqueous solution source 131 to the outer tub 102.

The flow rate controller 133 is provided at the phosphoric acid aqueous solution supply line 132 to control a supply amount of the phosphoric acid aqueous solution to be supplied to the outer tub 102. The flow rate controller 133 includes an opening/closing valve, a flow rate control valve, a flowmeter and the like.

The silicon supply 104 includes a silicon source 141, a silicon supply line 142, and a flow rate controller 143.

The silicon source 141 is a tank configured to store the silicon-containing compound aqueous solution. The silicon supply line 142 connects the silicon source 141 and the outer tub 102 to supply the silicon-containing compound aqueous solution from the silicon source 141 to the outer tub 102.

The flow rate controller 143 is provided at the silicon supply line 142 to control a supply amount of the silicon-containing compound aqueous solution to the outer tub 102. The flow rate controller 143 includes an opening/closing valve, a flow rate control valve, a flowmeter and the like. Since the supply amount of the silicon-containing compound aqueous solution is controlled by the flow rate controller 143, the silicon concentration in the etching liquid can be adjusted.

The DIW supply 105 includes a DIW source 151, a DIW supply line 152 and a flow rate controller 153. The DIW supply 105 is configured to supply the deionized water (DIW: pure water) to the outer tub 102 to replenish water vaporized by heating the etching liquid.

The DIW supply line 152 connects the DIW source 151 and the outer tub 102 to supply the DIW having a predetermined temperature from the DIW source 151 to the outer tub 102.

The flow rate controller 153 is provided at the DIW supply line 152 to control a supply amount of the DIW to the outer tub 102. The flow rate controller 153 includes an opening/closing valve, a flow rate control valve, a flowmeter and the like. Since the supply amount of the DIW is controlled by the flow rate controller 153, the temperature of the etching liquid and the phosphoric acid concentration and the silicon concentration in the etching liquid can be adjusted.

Furthermore, the processing tub 61 includes a circulation unit 106. The circulation unit 106 circulates the etching liquid between the inner tub 101 and the outer tub 102. The circulation unit 106 includes a circulation line 161, a plurality of processing liquid supply nozzles 162, a filter 163, a heater 164, and a pump 165.

The circulation line 161 connects the outer tub 102 and the inner tub 101. One end of the circulation line 161 is connected to the outer tub 102 and the other end of the circulation line 161 is connected to the processing liquid supply nozzles 162 placed within the inner tub 101.

The filter 163, the heater 164 and the pump 165 are provided at the circulation line 161. The filter 163 is configured to remove impurities from the etching liquid flowing in the circulation line 161. The heater 164 is configured to heat the etching liquid flowing in the circulation line 161 to a temperature suitable for the etching processing. The pump 165 is configured to send the etching liquid within the outer tub 102 to the circulation line 161. The pump 165, the heater 164 and the filter 163 are provided in this sequence from the upstream side.

The circulation unit 106 is configured to supply the etching liquid from the outer tub 102 into the inner tub 101 via the circulation line 161 and the processing liquid supply nozzles 162. The etching liquid supplied into the inner tub 101 overflows from the inner tub 101 and flows back into the outer tub 102. Accordingly, the etching liquid circulates between the inner tub 101 and the outer tub 102.

Further, the circulation unit 106 may set the etching liquid in a boiling state by heating the etching liquid with the heater 164.

Configuration of Liquid Recovery Unit and Cleaning Unit

A liquid recovery unit configured to receive the etching liquid overflown from the processing tub 61 is disposed around the processing tub 61. As stated above, the etching liquid includes the silicon-containing compound added thereto. With a decrease of the temperature of the etching liquid, however, there is a concern that the silicon-containing compound (for example, $SiO_2$) dissolved in the etching liquid may be precipitated. That is, the $SiO_2$ may be precipitated in the liquid recovery unit or in a liquid drain path for draining the etching liquid from the liquid recovery unit, and the liquid drain path may be clogged with the precipitated $SiO_2$.

Figure 3:
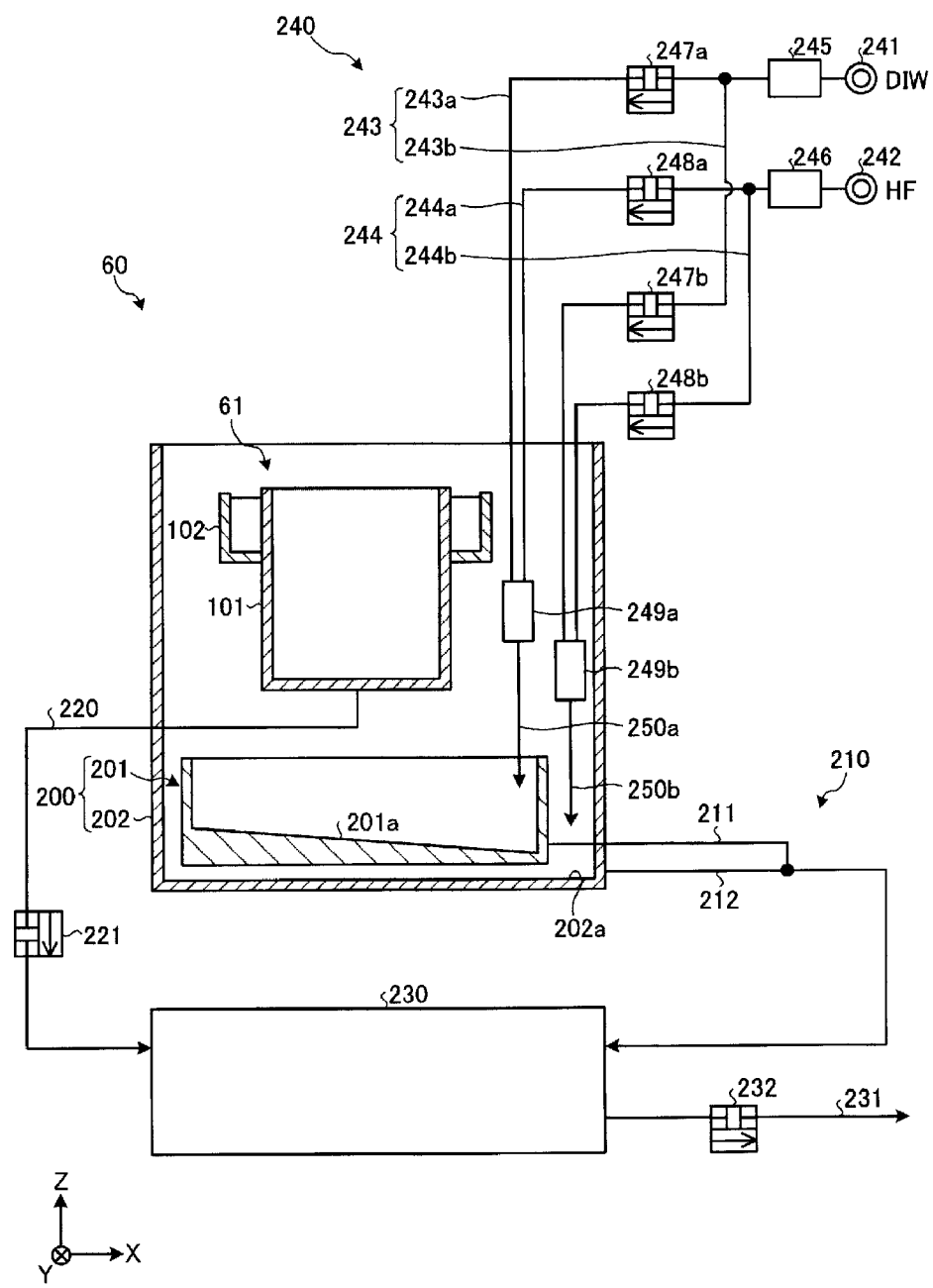
FIG. 3 is a diagram illustrating a configuration of an etching apparatus according to the exemplary embodiment.

The etching apparatus 60 according to the exemplary embodiment is equipped with a cleaning mechanism configured to clean the liquid recovery unit and the liquid drain path automatically, and is thus capable of suppressing the clogging of the liquid drain path for the processing liquid. A configuration of this etching apparatus 60 will be explained with reference to FIG. 3. FIG. 3 is a diagram illustrating the configuration of the etching apparatus 60 according to the exemplary embodiment.

As depicted in FIG. 3, the etching apparatus 60 is equipped with a liquid recovery unit 200, a liquid recovery unit drain line 210, a processing tub drain line 220, a cooling tank 230, and a cleaning unit 240.

The liquid recovery unit 200 is a receptacle which receives the etching liquid overflown from the processing tub 61. The liquid recovery unit 200 includes a first liquid recovery unit 201 and a second liquid recovery unit 202. Further, the term "etching liquid overflown from the processing tub 61" refers to the etching liquid coming out of the inner tub 101 or the outer tub 102 by being overflown, scattered or leaking from the inner tub 101 or the outer tub 102.

The first liquid recovery unit 201 is disposed under the processing tub 61. The first liquid recovery unit 201 receives a droplet of the etching liquid falling from the processing tub 61 by being overflown or leaking from the processing tub 61, for example.

A first drain line 211 through which the etching liquid received in the first liquid recovery unit 201 is drained from the first liquid recovery unit 201 is connected to a lower portion of a lateral side of the first liquid recovery unit 201. In the example shown in FIG. 3, the first drain line 211 is connected to a lower portion of a lateral side of the first liquid recovery unit 201 at a positive X-axis side.

The second liquid recovery unit 202 has a larger volume than the first liquid recovery unit 201, and accommodates therein the processing tub 61 and the first liquid recovery unit 201. The second liquid recovery unit 202 receives the etching liquid scattered from the processing tub 61 by, for example, boiling.

A bottom surface 201a of the first liquid recovery unit 201 is inclined downwards toward the first drain line 211. That is, a negative X-axis side of the bottom surface 201a of the first liquid recovery unit 201 is higher than a positive X-axis side thereof.

With this configuration, the etching liquid received by the first liquid recovery unit 201 can be drained from the first liquid recovery unit 201 efficiently. Further, the etching liquid can be suppressed from remaining within the first liquid recovery unit 201.

A second drain line 212 through which the etching liquid received in the second liquid recovery unit 202 is drained from the second liquid recovery unit 202 is connected to a lower portion of a lateral side of the second liquid recovery unit 202. In the example shown in FIG. 3, the second drain line 212 is connected to a lower portion of a lateral side of the second liquid recovery unit 202 at a positive X-axis side.

The liquid recovery unit drain line 210 connects the liquid recovery unit 200 and the cooling tank 230, and drains the etching liquid received by the liquid recovery unit 200 into the cooling tank 230. The liquid recovery unit drain line 210 is branched into the aforementioned first drain line 211 and second drain line 212 at an upstream side. The first drain line 211 is connected to the first liquid recovery unit 201, and the second drain line 212 is connected to the second liquid recovery unit 202.

Further, the liquid recovery unit drain line 210 may be equipped with first drain line 211 and the second drain line 212 which are independent from each other.

The processing tub drain line 220 connects the processing tub 61, specifically, the inner tub 101 and the cooling tank 230, and drains the etching liquid stored in the inner tub 101 into the cooling tank 230. An opening/closing valve 221 configured to open or close the processing tub drain line 220 is provided at a portion of the processing tub drain line 220.

The cooling tank 230 is connected to the first liquid recovery unit 201 and the second liquid recovery unit 202 via the liquid recovery unit drain line 210. Further, the cooling tank 230 is connected to the processing tub 61 via the processing tub drain line 220. The cooling tank 230 is configured to temporarily store therein the etching liquid drained from the processing tub 61, the first liquid recovery unit 201 and the second liquid recovery unit 202.

The cooling tank 230 is connected to a cooling tank drain line 231 through which the etching liquid stored in the cooling tank 230 is drained from the cooling tank 230. The cooling tank drain line 231 is provided with an opening/closing valve 232 which is configured to open or close the cooling tank drain line 231.

The etching liquid drained from the processing tub 61, the first liquid recovery unit 201 and the second liquid recovery unit 202 are cooled while being stored in the cooling tank 230, and is then drained to an outside of the substrate processing apparatus 1 via the cooling tank drain line 231.

The cleaning unit 240 is configured to supply a cleaning liquid for cleaning the liquid recovery unit 200, the liquid recovery unit drain line 210, the cooling tank 230 and the cooling tank drain line 231 into the liquid recovery unit 200.

The cleaning unit 240 is equipped with a DIW source 241 and a HF source 242. The DIW source 241 is configured to supply DIW. The HF source 242 is configured to supply HF (hydrogen fluoride in a liquid state).

Further, the cleaning unit 240 is equipped with a DIW supply line 243, a HF supply line 244, a DIW flow rate controller 245, a HF flow rate controller 246, a first DIW opening/closing valve 247a, a second DIW opening/closing valve 247b, a first HF opening/closing valve 248a, and a second HF opening/closing valve 248b. Further, the cleaning unit 240 is equipped with a first mixer 249a, a second mixer 249b, a first discharge line 250a, and a second discharge line 250b.

The DIW supply line 243 is connected to the DIW source 241. The DIW supply line 243 is branched into a first DIW supply line 243a and a second DIW supply line 243b. The first DIW supply line 243a is connected to the first mixer 249a via the first DIW opening/closing valve 247a. The second DIW supply line 243b is connected to the second mixer 249b via the second DIW opening/closing valve 247b.

The HF supply line 244 is connected to the HF source 242. The HF supply line 244 is branched into a first HF supply line 244a and a second HF supply line 244b. The first HF supply line 244a is connected to the first mixer 249a via the first HF opening/closing valve 248a. The second HF supply line 244b is connected to the second mixer 249b via the second HF opening/closing valve 248b.

The DIW flow rate controller 245 is provided upstream of a branch point between the first DIW supply line 243a and the second DIW supply line 243b of the DIW supply line 243, and configured to adjust a flow rate of the DIW flowing in the DIW supply line 243. The HF flow rate controller 246 is provided upstream of a branch point between the first HF supply line 244a and the second HF supply line 244b of the HF supply line 244, and configured to adjust a flow rate of the HF flowing in the HF supply line 244.

The first DIW opening/closing valve 247a is provided at a portion of the first DIW supply line 243a and configured to open or close the first DIW supply line 243a. The second DIW opening/closing valve 247b is provided at a portion of the second DIW supply line 243b and configured to open or close the second DIW supply line 243b. The first HF opening/closing valve 248a is provided at a portion of the first HF supply line 244a and configured to open or close the first HF supply line 244a. The second HF opening/closing valve 248b is provided at a portion of the second HF supply line 244b and configured to open or close the second HF supply line 244b.

The first mixer 249a is connected to the first DIW supply line 243a and the first HF supply line 244a at an upstream side. The first mixer 249a is configured to mix the DIW supplied from the DIW source 241 through the first DIW supply line 243a and the HF supplied from the HF source 242 through the first HF supply line 244a.

The second mixer 249b is connected to the second DIW supply line 243b and the second HF supply line 244b at an upstream side. The second mixer 249b is configured to mix the DIW supplied from the DIW source 241 through the second DIW supply line 243b and the HF supplied from the HF source 242 through the second HF supply line 244b.

The first discharge line 250a is connected to the first mixer 249a at an upstream side, and configured to discharge DHF (dilute hydrofluoric acid), which is a mixed solution of the DIW and the HF generated by the first mixer 249a, toward the bottom surface 201a of the first liquid recovery unit 201. Further, when the first DIW opening/closing valve 247a is opened and the first HF opening/closing valve 248a is closed, the first discharge line 250a is capable of discharging the DIW. Furthermore, when the first DIW opening/closing valve 247a is closed and the first HF opening/closing valve 248a is opened, the first discharge line 250a is capable of discharging the HF.

The second discharge line 250b is connected to the second mixer 249b at an upstream side, and configured to discharge DHF generated by the second mixer 249b toward the bottom surface 202a of the second liquid recovery unit 202. Further, when the second DIW opening/closing valve 247b is opened and the second HF opening/closing valve 248b is closed, the second discharge line 250b is capable of discharging the DIW. Furthermore, when the second DIW opening/closing valve 247b is closed and the second HF opening/closing valve 248b is opened, the second discharge line 250b is capable of discharging the HF.

The HF included in the cleaning liquid is capable of dissolving the $SiO_2$ precipitated from the etching liquid. Accordingly, by supplying the DHF as the cleaning liquid to the liquid recovery unit 200, the $SiO_2$ adhering to the liquid recovery unit 200 can be dissolved and removed from the liquid recovery unit 200. Further, the cleaning liquid supplied to the liquid recovery unit 200 flows through the liquid recovery unit drain line 210, the cooling tank 230 and the cooling tank drain line 231. Accordingly, the $SiO_2$ adhering to the liquid recovery unit drain line 210, the cooling tank 230 and the cooling tank drain line 231 can be dissolved and removed from the liquid recovery unit drain line 210, the cooling tank 230 and the cooling tank drain line 231.

As stated above, the etching apparatus 60 according to the exemplary embodiment is capable of dissolving the $SiO_2$ adhering to the liquid recovery unit 200, the liquid recovery unit drain line 210, the cooling tank 230 and the cooling tank drain line 231 by supplying the cleaning liquid including the HF to the liquid recovery unit 200. Therefore, in the etching apparatus 60 according to the exemplary embodiment, clogging of the liquid drain path for the etching liquid can be suppressed.

Specific Operation of Etching Apparatus

Figure 4:
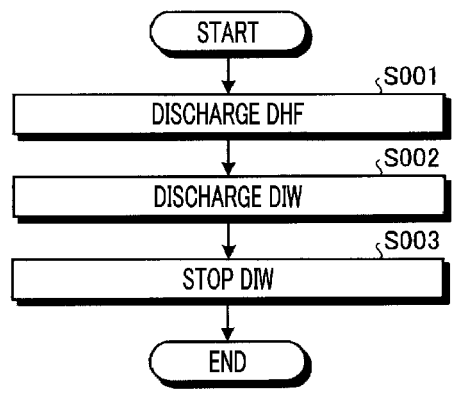
FIG. 4 is a flowchart illustrating a sequence of a cleaning processing according to the exemplary embodiment.

FIG. 4 is a flowchart illustrating a processing sequence of a cleaning processing according to the exemplary embodiment. The etching apparatus 60 performs the processing sequence shown in FIG. 4 under the control of the controller 7.

As depicted in FIG. 4, the etching apparatus 60 first discharges DHF to the liquid recovery unit 200 (process S001). To elaborate, the etching apparatus 60 opens the first DIW opening/closing valve 247a, the second DIW opening/closing valve 247b, the first HF opening/closing valve 248a, and the second HF opening/closing valve 248b. Accordingly, DIW and HF are supplied to the first mixer 249a, and DHF mixed by the first mixer 249a is supplied to the first liquid recovery unit 201 from the first discharge line 250a. Further, the DIW and the HF are supplied to the second mixer 249b as well, and DHF mixed by the second mixer 249b is supplied to the second liquid recovery unit 202 from the second discharge line 250b.

Subsequently, the etching apparatus 60 closes the first HF opening/closing valve 248a and the second HF opening/closing valve 248b, thus allowing the DIW to be discharged to the liquid recovery unit 200 (process S002). Then, the etching apparatus 60 closes the first DIW opening/closing valve 247a and the second DIW opening/closing valve 247b, thus stopping the discharge of the DIW to the liquid recovery unit 200 (process S003) and ending the cleaning processing.

As stated above, the etching apparatus 60 may finish the cleaning processing of discharging the DIW to the liquid recovery unit 200 after discharging the DHF to the liquid recovery unit 200. Accordingly, the DHF can be suppressed from remaining in the liquid recovery unit 200, the liquid recovery unit drain line 210, the cooling tank 230 and the cooling tank drain line 231.

Modification Examples of Cleaning Processing

Figure 5:
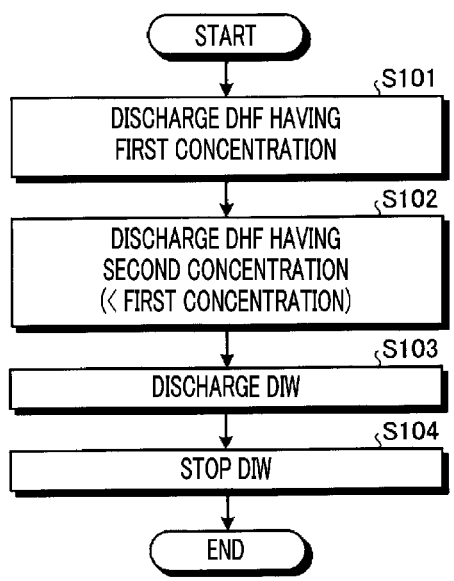
FIG. 5 is a flowchart illustrating a sequence of a cleaning processing according to a first modification example.
Figure 6:
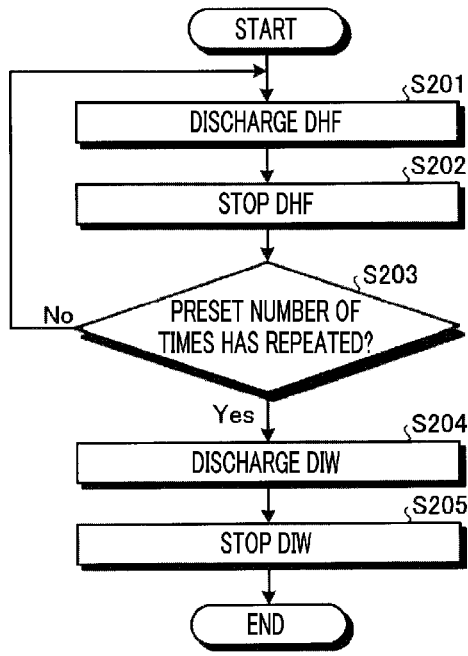
FIG. 6 is a flowchart illustrating a sequence of a cleaning processing according to a second modification example.
Figure 7:
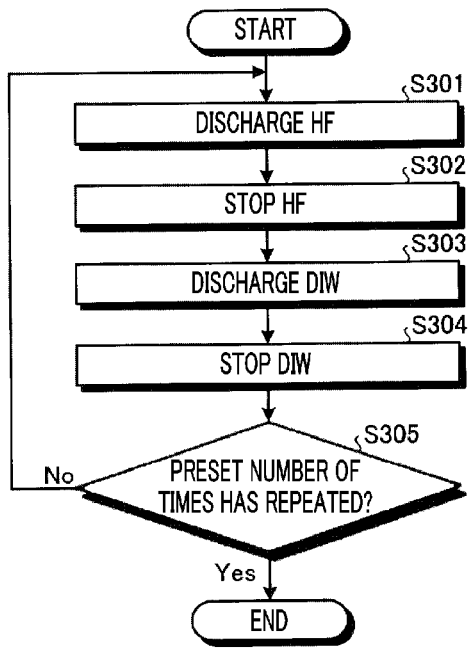
FIG. 7 is a flowchart illustrating a sequence of a cleaning processing according to a third modification example.

Here, other examples of the above-described cleaning processing will be discussed with reference to FIG. 5 to FIG. 7. FIG. 5 is a flowchart illustrating a processing sequence of a cleaning processing according to a first modification example. FIG. 6 is a flowchart illustrating a processing sequence of a cleaning processing according to a second modification example. FIG. 7 is a flowchart illustrating a processing sequence of a cleaning processing according to a third modification example. Further, the etching apparatus 60 performs the processing sequences shown in FIG. 5 to FIG. 7 under the control of the controller 7.

As depicted in FIG. 5, the etching apparatus 60 first opens the respective opening/closing valves 247a, 247b, 248a and 248b, thus allowing DHF having a first concentration to be discharged to the first liquid recovery unit 201 and the second liquid recovery unit 202 (process S101). The DHF having the first concentration is obtained by adjusting flow rates of DIW and HF by using the DIW flow rate controller 245 and the HF flow rate controller 246.

Subsequently, the etching apparatus 60 discharges DHF having a second concentration lower than the first concentration to the first liquid recovery unit 201 and the second liquid recovery unit 202 (process S102). By way of example, the etching apparatus 60 may produce the DHF having the second concentration by changing the flow rate ratios of the DIW and the HF by using the DIW flow rate controller 245 and the HF flow rate controller 246.

As stated above, the etching apparatus 60 may first discharge the DHF having the first concentration with a relatively high HF concentration to the liquid recovery unit 200, and then discharge the DHF having the second concentration with a relatively low HF concentration to the liquid recovery unit 200. Accordingly, it is possible to clean the liquid recovery unit 200, the liquid recovery unit drain line 210, the cooling tank 230 and the cooling tank drain line 231 efficiently while suppressing consumption of HF.

Thereafter, the etching apparatus 60 closes the first HF opening/closing valve 248a and the second HF opening/closing valve 248b, thus allowing the DIW to be discharged to the first liquid recovery unit 201 and the second liquid recovery unit 202 (process S103). Then, the etching apparatus 60 closes the first DIW opening/closing valve 247a and the second DIW opening/closing valve 247b, thus stopping the discharge of the DIW to the first liquid recovery unit 201 and the second liquid recovery unit 202 (process S104) and ending the cleaning processing.

As another example, the etching apparatus 60 first opens the respective opening/closing valves 247a, 247b, 248a and 248b, thus allowing DHF to be discharged to the first liquid recovery unit 201 and the second liquid recovery unit 202 (process S201), as shown in FIG. 6. Then, the etching apparatus 60 closes the respective opening/closing valves 247a, 247b, 248a and 248b, thus stopping the discharge of the DHF to the first liquid recovery unit 201 and the second liquid recovery unit 202 (process S202).

Subsequently, the etching apparatus 60 determines whether a processing of the processes S201 to S202 has been repeated a preset number of times (process S203). In this process, if a repetition number of the processing of the processes S201 and S202 has not reached the preset number of times (process S203, No), the etching apparatus 60 returns to the process S201 and repeats the processing of the processes S201 and S202.

Meanwhile, assume that the repetition number of the processing of the processes S201 and S202 has reached the preset number of times (process S203, Yes). In this case, the etching apparatus 60 closes the first HF opening/closing valve 248a and the second HF opening/closing valve 248b, thus allowing DIW to be discharged to the first liquid recovery unit 201 and the second liquid recovery unit 202 (process S204). Then, the etching apparatus 60 closes the first DIW opening/closing valve 247a and the second DIW opening/closing valve 247b, thus stopping the discharge of the DIW to the first and second liquid recovery units 201 and 202 (process S205) and ending the cleaning processing.

As described above, the etching apparatus 60 may discharge the DHF to the liquid recovery unit 200 intermittently. As compared to a case where the DHF is discharged continuously, a flow of the DHF may be disturbed. As a consequence, a physical force for removing a foreign substance such as $SiO_2$ from the liquid recovery unit 200 or the like can be enhanced.

Further, the etching apparatus 60 may also repeat the processing of the processes S204 and S205 a preset number of times. That is, the etching apparatus 60 may discharge the DIW intermittently as well as the DHF. In this case, the etching apparatus 60 may set an interval between a stopping of the discharge of the DIW and a resuming of the discharge of the DIW to be shorter than an interval between a stopping of the discharge of the DHF and a resuming of the discharge of the DHF. Accordingly, the DHF can be more securely suppressed from remaining in the liquid recovery unit 200, the liquid recovery unit drain line 210, the cooling tank 230 and the cooling tank drain line 231.

As still another example, the etching apparatus 60 first opens the first HF opening/closing valve 248a and the second HF opening/closing valve 248b, thus allowing HF to be discharged to the first liquid recovery unit 201 and the second liquid recovery unit 202 (process S301), as shown in FIG. 7. Then, the etching apparatus 60 closes the first HF opening/closing valve 248a and the second HF opening/closing valve 248b, thus stopping the discharge of the HF to the first and second liquid recovery units 201 and 202 (process S302).

Subsequently, the etching apparatus 60 closes the first HF opening/closing valve 248a and the second HF opening/closing valve 248b, and opens the first DIW opening/closing valve 247a and the second DIW opening/closing valve 247b. Accordingly, the etching apparatus 60 discharges DIW to the first liquid recovery unit 201 and the second liquid recovery unit 202 (process S303). Thereafter, the etching apparatus 60 closes the first DIW opening/closing valve 247a and the second DIW opening/closing valve 247b, thus stopping the discharge of the DIW to the first liquid recovery unit 201 and the second liquid recovery unit 202 (process S304).

Next, the etching process 60 determines whether a processing of the processes S301 to S304 has been repeated a preset number of times (process S305). In this process, if a repetition number of the processing of the processes S301 to S304 has not reached the preset number of times (process S305, No), the etching apparatus 60 returns to the process S301, and repeats the processing of the processes S301 to S304. Meanwhile, if it is determined in the process S305 that the repetition number of the processing of the processes S301 to S304 has reached the preset number of times (process S305, Yes), the etching apparatus 60 ends the cleaning processing.

As stated above, the etching apparatus 60 may discharge the HF and the DIW to the liquid recovery unit 200 alternately. In this case, as the HF and the DIW are mixed in the liquid recovery unit 200, DHF can be produced in the liquid recovery unit 200.

Further, here, the DIW is discharged to the liquid recovery unit 200 after the HF is discharged thereto. However, the etching apparatus 60 may discharge the HF to the liquid recovery unit 200 after discharging the DIW thereto. In this case, after it is determined in the process S305 that the repetition number has reached the preset number of times, the cleaning processing may be ended after the DIW is discharged to the liquid recovery unit 200 for a preset time period.

Modification Example of First Discharge Line

Figure 8:
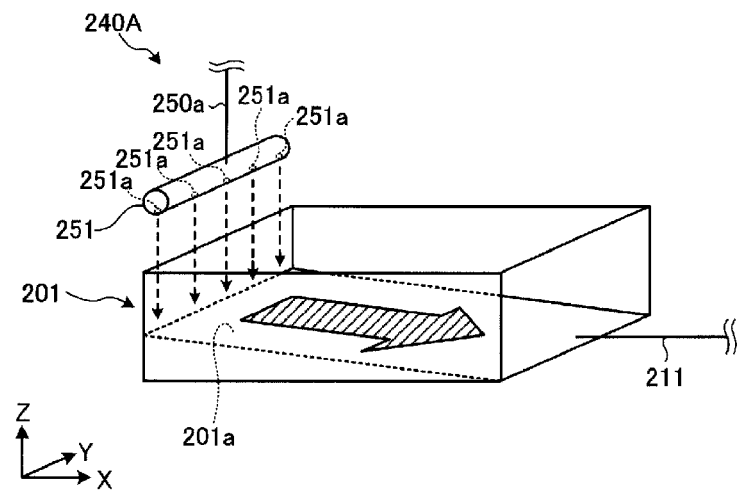
FIG. 8 is a diagram illustrating a configuration of a cleaning unit according to a fourth modification example.
Figure 9:
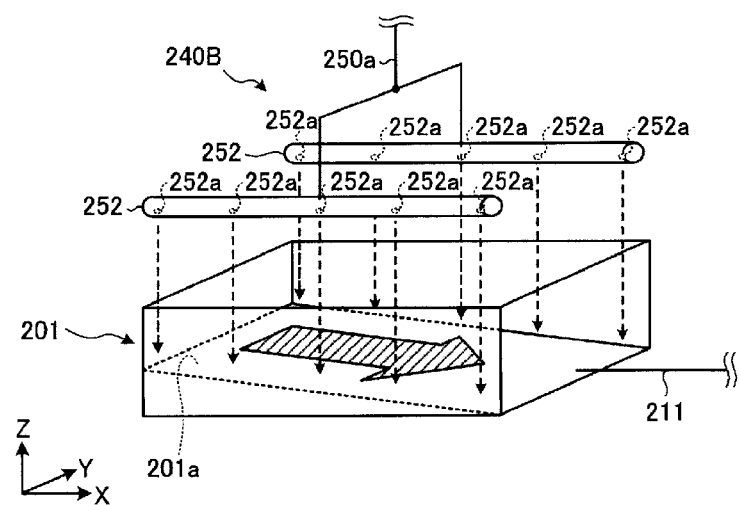
FIG. 9 is a diagram illustrating a configuration of a cleaning unit according to a fifth modification example.

Now, modification examples of the cleaning unit will be explained with reference to FIG. 8 and FIG. 9. FIG. 8 is a diagram illustrating a configuration of a cleaning unit according to a fourth modification example. FIG. 9 is a diagram illustrating a configuration of a cleaning unit according to a fifth modification example.

As illustrated in FIG. 8, a cleaning unit 240A according to the fourth modification example is equipped with a discharge unit 251. The discharge unit 251 is connected to a downstream end of the first discharge line 250a.

The discharge unit 251 is disposed above an upper side of the inclined bottom surface 201a of the first liquid recovery unit 201, that is, above an opposite side from a side where the first drain line 211 is provided. By providing the discharge unit 251 at this position, the DHF or the like can be flown along the inclined bottom surface 201a, so that a flow velocity of the DHF or the like can be increased. By increasing the flow velocity of the DHF or the like in this way, a foreign substance adhering to the first liquid recovery unit 201 or the like can be removed more efficiently.

The discharge unit 251 has a multiple number of discharge openings 251a. These discharge openings 251a are arranged along a width direction of the inclined bottom surface 201a (a horizontal direction orthogonal to a horizontal direction in which a slope is extended) (here, Y-axis direction). In this way, by arranging the multiple number of discharge openings 251a along the width direction of the bottom surface 201a, the DHF or the like can be diffused to the first liquid recovery unit 201 uniformly.

As depicted in FIG. 9, a cleaning unit 240B according to the fifth modification example includes a multiple number of discharge units 252. These discharge units 252 are connected to a downstream end of the first discharge line 250a. In the example shown in FIG. 9, the cleaning unit 240B is equipped with two discharge units 252. One of the two discharge units 252 is disposed at one of two opposite sides of the bottom surface 201a in a width direction thereof, and the other of the two discharge units 252 is disposed at the other of the two opposite sides of the bottom surface 201a in the width direction thereof.

Each discharge unit 252 has a multiple number of discharge openings 252a. These discharge openings 252a are arranged along a horizontal direction (a horizontal component of an inclination direction) in which the slope of the bottom surface 201a is extended (here, the X-axis direction). By arranging the multiple number of discharge openings 252a along the inclination direction of the inclined bottom surface 201a, the first liquid recovery unit 201 can be cleaned more efficiently.

As stated above, the substrate processing apparatus (as an example, the etching apparatus 60) according to the exemplary embodiment includes a processing tub (as an example, the processing tub 61), a liquid recovery unit (as an example, the liquid recovery unit 200), a liquid recovery unit drain line (as an example, the liquid recovery unit drain line 210), a storage (as an example, the cooling tank 230), a first liquid supply line (as an example, the DIW supply line 243), a second liquid supply line (as an example, the HF supply line 244), a discharge line (as an example, the first discharge line 250a and the second discharge lint 250b), a first liquid flow rate controller (as an example, the DIW flow rate controller 245), and a second liquid flow rate controller (as an example, the HF flow rate controller 246). The processing tub is configured to accommodate therein a multiple number of substrates (as an example, wafers W), and stores a processing liquid (as an example, the etching liquid) therein. The liquid recovery unit is configured to receive the processing liquid overflown from the processing tub. The liquid recovery unit drain line drains the processing liquid from the liquid recovery unit. The storage is connected to the liquid recovery unit via the liquid recovery unit drain line, and stores therein the processing liquid drained from the liquid recovery unit. The first liquid supply line supplies a first liquid of a cleaning liquid containing a first liquid (as an example, the DIW) and a second liquid (as an example, the HF) for removing a precipitate (as an example, the $SiO_2$) from the processing liquid. The second liquid supply line supplies a second liquid. The discharge line is connected to the first liquid supply line and the second liquid supply line, and supplies the cleaning liquid, the first liquid or the second liquid to the liquid recovery unit. The first liquid flow rate controller is provided at the first liquid supply line, and configured to adjust a flow rate of the first liquid flowing in the first liquid supply line. The second liquid flow rate controller is provided at the second liquid supply line, and configured to adjust a flow rate of the second liquid flowing in the second liquid supply line.

Thus, in the substrate processing apparatus according to the exemplary embodiment, clogging of the liquid drain line(s) can be suppressed in the substrate processing apparatus which performs a batch processing.

The first liquid may be pure water, and the second liquid may be hydrogen fluoride. Further, the processing liquid may contain phosphoric acid and a dissolved silicon-containing compound. The hydrogen fluoride included in the cleaning liquid, that is, the dilute hydrofluoric acid is capable of dissolving the $SiO_2$ precipitated from the processing liquid. Thus, by supplying the dilute hydrofluoric acid as the cleaning liquid to the liquid recovery unit, the $SiO_2$ adhering to the liquid recovery unit can be dissolved and thus removed from the liquid recovery unit. Further, the cleaning liquid supplied to the liquid recovery unit flows in the liquid recovery unit drain line and the storage. Therefore, the $SiO_2$ adhering to the liquid recovery unit drain line and the storage can be dissolved and removed from the liquid recovery unit drain line and the storage.

The substrate processing apparatus according to the exemplary embodiment may further include a controller configured to control the first liquid flow rate controller and the second liquid flow rate controller. In this case, the controller may adjust a concentration of the cleaning liquid by controlling the first liquid flow rate controller and the second liquid flow rate controller. Accordingly, a more effective cleaning processing can be carried out.

The liquid recovery unit may include a first liquid recovery unit (as an example, the first liquid recovery unit 201) disposed under the processing tub; and a second liquid recovery unit (as an example, the second liquid recovery unit 202) accommodating the processing tub and the first liquid recovery unit. Further, the liquid recovery unit drain line may include a first drain line (as an example, the first drain line 211) which is connected to the first liquid recovery unit and through which the processing liquid is drained from the first liquid recovery unit; and a second drain line (as an example, the second drain line 212) which is connected to the second liquid recovery unit and through which the processing liquid is drained from the second liquid recovery unit. Further, the first liquid recovery unit may have a bottom surface (as an example, the bottom surface 201*a*) inclined downwards toward the first drain line.

With this configuration, the processing liquid received by the first liquid recovery unit can be efficiently drained from the first liquid recovery unit. Further, the processing liquid can be suppressed from remaining in the first liquid recovery unit.

The discharge line may be equipped with a discharge unit (as an example, the discharge unit 251) having a multiple number of discharge openings (as an example, the discharge openings 251*a*) arranged along a width direction of the bottom surface. By arranging the multiple number of discharge openings along the width direction of the bottom surface, the cleaning liquid or the like can be uniformly diffused to the first liquid recovery unit.

The discharge line may be equipped with a discharge unit (as an example, the discharge unit 252) having a multiple number of discharge openings (as an example, the discharge openings 252*a*) arranged along an inclination direction of the bottom surface. By arranging the multiple number of discharge openings along the inclination direction of the inclined bottom surface, the first liquid recovery unit can be cleaned more efficiently.

Furthermore, an apparatus cleaning method according to the exemplary embodiment is an apparatus cleaning method of cleaning the substrate processing apparatus (as an example, the etching apparatus 60) according to the exemplary embodiment, and includes a supplying process and an adjusting process. In the supplying process, the cleaning liquid (as an example, the DHF), the first liquid (as an example, the DIW) and the second liquid (as an example, the HF) are supplied to the liquid recovery unit (as an example, the first liquid recovery unit 201 and the second liquid recovery unit 202) from the discharge line (as an example, the first discharge line 250*a* and the second liquid discharge line 250*b*). In the adjusting process, flow rates of the first liquid and the second liquid are adjusted by using the first liquid flow rate controller (as an example, the DIW flow rate controller 245) and the second liquid flow rate controller (as an example, the HF flow rate controller 246). Thus, according to the apparatus cleaning method of the exemplary embodiment, it is possible to suppress clogging of the liquid drain line(s) in the substrate processing apparatus which performs the batch processing.

The first liquid may be pure water, and the second liquid may be hydrogen fluoride. In this case, in the supplying process, the cleaning liquid adjusted to a first concentration through the adjusting process may be first supplied to the liquid recovery unit, and, then, the cleaning liquid adjusted to a second concentration lower than the first concentration through the adjusting process may be supplied to the liquid recovery unit. Accordingly, it is possible to efficiently clean the liquid recovery unit, the liquid recovery unit drain line and the storage while suppressing the consumption amount of the second liquid.

In the supplying process, the cleaning liquid may be supplied to the liquid recovery unit intermittently. In this case, a flow of the cleaning liquid may be disturbed as compared to a case where the cleaning liquid is continuously discharged. Therefore, a physical force for removing a precipitate from the liquid recovery unit or the like can be enhanced.

In the supplying process, supplying the first liquid from the first liquid supply line to the liquid recovery unit and supplying the second liquid from the second liquid supply line to the liquid recovery unit may be repeated. In this case, as the first liquid and the second liquid are mixed in the liquid recovery unit, the cleaning liquid can be produced in the liquid recovery unit.

According to the exemplary embodiment, it is possible to suppress clogging of a liquid drain line in the substrate processing apparatus configured to perform a batch processing.

The exemplary embodiments disclosed herein are illustrative in all aspects and not limited thereto. In fact, the above exemplary embodiments can be embodied in various forms. Further, the above-described exemplary embodiments may be omitted, substituted, or changed in various forms without departing from the scope of the appended claims.

From the foregoing, it will be appreciated that various exemplary embodiments of the present disclosure have been described herein for the purposes of illustration, and that various modifications may be made without departing from the scope and spirit of the present disclosure. Accordingly, the various exemplary embodiments disclosed herein are not intended to be limiting, with the true scope and spirit being indicated by the following claims.

We claim:

1. A substrate processing apparatus, comprising:
    a processing tub allowed to accommodate therein multiple substrates, and configured to store therein a processing liquid;
    a liquid recovery unit configured to receive the processing liquid overflown from the processing tub;
    a liquid recovery unit drain line configured to drain the processing liquid from the liquid recovery unit;
    a storage connected to the liquid recovery unit via the liquid recovery unit drain line, and configured to store therein the processing liquid drained from the liquid recovery unit;
    a first liquid supply line configured to supply a first liquid of a cleaning liquid configured to remove a precipitate from the processing liquid, the cleaning liquid containing the first liquid and a second liquid;
    a second liquid supply line configured to supply the second liquid;
    a discharge line connected to the first liquid supply line and the second liquid supply line, and configured to discharge the cleaning liquid, the first liquid or the second liquid toward the liquid recovery unit;
    a first liquid flow rate controller provided at the first liquid supply line, and configured to adjust a flow rate of the first liquid flowing in the first liquid supply line; and
    a second liquid flow rate controller provided at the second liquid supply line, and configured to adjust a flow rate of the second liquid flowing in the second liquid supply line, wherein the liquid recovery unit comprises:
a first liquid recovery unit disposed under the processing tub; and
a second liquid recovery unit,
wherein the processing tub and the first liquid recovery unit are disposed within the second liquid recovery unit.

2. The substrate processing apparatus of claim 1,
wherein the first liquid is pure water,
the second liquid is hydrogen fluoride, and
the processing liquid contains phosphoric acid and a dissolved silicon-containing compound.

3. The substrate processing apparatus of claim 2, further comprising:
a controller configured to control the first liquid flow rate controller and the second liquid flow rate controller,
wherein the controller adjusts a concentration of the cleaning liquid by controlling the first liquid flow rate controller and the second liquid flow rate controller.

4. The substrate processing apparatus of claim 3,
wherein the liquid recovery unit drain line comprises:
a first drain line connected to the first liquid recovery unit, and configured to drain the processing liquid from the first liquid recovery unit; and
a second drain line connected to the second liquid recovery unit, and configured to drain the processing liquid from the second liquid recovery unit, and
wherein the first liquid recovery unit has a bottom surface inclined downwards toward the first drain line.

5. The substrate processing apparatus of claim 2,
wherein the liquid recovery unit drain line comprises:
a first drain line connected to the first liquid recovery unit, and configured to drain the processing liquid from the first liquid recovery unit; and
a second drain line connected to the second liquid recovery unit, and configured to drain the processing liquid from the second liquid recovery unit, and
wherein the first liquid recovery unit has a bottom surface inclined downwards toward the first drain line.

6. The substrate processing apparatus of claim 5,
wherein the discharge line is equipped with a discharge unit having multiple discharge openings arranged in a width direction of the bottom surface.

7. The substrate processing apparatus of claim 5,
wherein the discharge line is equipped with a discharge unit having multiple discharge openings arranged in an inclination direction of the bottom surface.

8. The substrate processing apparatus of claim 1, further comprising:
a controller configured to control the first liquid flow rate controller and the second liquid flow rate controller,
wherein the controller adjusts a concentration of the cleaning liquid by controlling the first liquid flow rate controller and the second liquid flow rate controller.

9. The substrate processing apparatus of claim 8,
wherein the liquid recovery unit drain line comprises:
a first drain line connected to the first liquid recovery unit, and configured to drain the processing liquid from the first liquid recovery unit; and
a second drain line connected to the second liquid recovery unit, and configured to drain the processing liquid from the second liquid recovery unit, and
wherein the first liquid recovery unit has a bottom surface inclined downwards toward the first drain line.

10. The substrate processing apparatus of claim 1,
wherein the liquid recovery unit drain line comprises:
a first drain line connected to the first liquid recovery unit, and configured to drain the processing liquid from the first liquid recovery unit; and
a second drain line connected to the second liquid recovery unit, and configured to drain the processing liquid from the second liquid recovery unit, and
wherein the first liquid recovery unit has a bottom surface inclined downwards toward the first drain line.

11. The substrate processing apparatus of claim 10,
wherein the discharge line is equipped with a discharge unit having multiple discharge openings arranged in a width direction of the bottom surface.

12. The substrate processing apparatus of claim 10,
wherein the discharge line is equipped with a discharge unit having multiple discharge openings arranged in an inclination direction of the bottom surface.

13. An apparatus cleaning method of cleaning a substrate processing apparatus as claimed in claim 1, the apparatus cleaning method comprising:
supplying the cleaning liquid, the first liquid or the second liquid to the liquid recovery unit from the discharge line; and
adjusting the flow rates of the first liquid and the second liquid by using the first liquid flow rate controller and the second liquid flow rate controller.

14. The apparatus cleaning method of claim 13,
wherein the first liquid is pure water,
the second liquid is hydrogen fluoride, and
in the supplying of the cleaning liquid, the first liquid or the second liquid, the cleaning liquid adjusted to a first concentration through the adjusting of the flow rates of the first liquid and the second liquid is first supplied to the liquid recovery unit, and, then, the cleaning liquid adjusted to a second concentration lower than the first concentration through the adjusting of the flow rates of the first liquid and the second liquid is supplied to the liquid recovery unit.

15. The apparatus cleaning method of claim 14,
wherein in the supplying of the cleaning liquid, the first liquid or the second liquid, the cleaning liquid is supplied to the liquid recovery unit intermittently.

16. The apparatus cleaning method of claim 13,
wherein in the supplying of the cleaning liquid, the first liquid or the second liquid, the cleaning liquid is supplied to the liquid recovery unit intermittently.

17. The apparatus cleaning method of claim 13,
wherein in the supplying of the cleaning liquid, the first liquid or the second liquid, supplying the first liquid supplied from the first liquid supply line to the liquid recovery unit and supplying the second liquid supplied from the second liquid supply line to the liquid recovery unit are repeated.

* * * * *